United States Patent [19]
Olbright et al.

[11] Patent Number: 5,283,447
[45] Date of Patent: Feb. 1, 1994

[54] INTEGRATION OF TRANSISTORS WITH VERTICAL CAVITY SURFACE EMITTING LASERS

[75] Inventors: Gregory R. Olbright; Jack L. Jewell, both of Boulder, Colo.

[73] Assignee: Bandgap Technology Corporation, Broomfield, Colo.

[21] Appl. No.: 823,496

[22] Filed: Jan. 21, 1992

[51] Int. Cl.$^5$ .......................................... H01L 33/00
[52] U.S. Cl. ...................................... 257/85; 257/97; 257/197; 257/96; 372/50; 372/48
[58] Field of Search ............ 372/50, 43, 48; 357/19, 357/17, 30 P, 30 I, 30 G; 257/17, 13, 15, 96, 97, 98, 187, 197, 22, 85

[56] References Cited

U.S. PATENT DOCUMENTS

| | | | |
|---|---|---|---|
| 4,521,888 | 6/1985 | Hayashi et al. | 372/50 |
| 4,733,399 | 3/1988 | Mihashi et al. | 372/50 |
| 4,949,350 | 8/1990 | Jewell et al. | 372/45 |
| 4,987,468 | 1/1991 | Thornton | 257/96 X |
| 5,034,344 | 7/1991 | Jewell et al. | 437/129 |
| 5,132,982 | 7/1992 | Chan et al. | 372/17 X |
| 5,181,085 | 1/1993 | Moon et al. | 257/96 X |
| 5,202,896 | 4/1993 | Taylor | 372/50 |

FOREIGN PATENT DOCUMENTS

| | | | |
|---|---|---|---|
| 59-113678 | 6/1984 | Japan | 372/50 |
| 61-26277 | 2/1986 | Japan | 372/50 |
| 63-56955 | 3/1988 | Japan | 372/50 |

OTHER PUBLICATIONS

Olbright et al., "Cascadable Laser Logic Devices: Discrete Integration of Phototransistors with Surface-E-mitting Laser Diodes," *Electronics Letters*, vol. 27, No. 3, Jan. 31, 1991, pp. 216-217.

Jewell et al., "Vertical Cavity Single Quantum Well Laser," *Appl. Phys. Lett.*, 55 (5);31 Jul. 1989, pp. 424-426.

Matsueda et al., "Integration of a Laser Diode and a Twin FET," *Japanese Journal of Applied Physics*, vol. 20, Supplement 20-21, 1981, pp. 193-197.

Jewell et al., "Vertical Cavity Single Quantum Well Laser," *Appl. Phys., Lett.*, vol. 55, Jul., 1989, pp. 424-426.

Jewell et al., "Low Threshold Electrically-Pumped Vertical Cavity Emitting Micro-lasers," *Electronic Letters*, vol. 25, Aug., 1989, pp. 1123-1124.

Jewell et al., "Vertical Cavity Lasers for Optical Interconnects," *SPIE vol. 1389 International Conference on Advances in Interconnection and Packaging*, 1990, pp. 401-407.

Olbright et al., "Cascadable Laser Logic Devices: Discrete Integration of Phototransistors with Surface Emitting Laser Diodes," *Electronics Letters*, vol. 27, No. 3, Jan. 31, 1991, pp. 216-217.

Jewell et al., "Vertical-Cavity Surface-Emitting Lasers: Design, Growth, Fabrication, Characterization," *IEEE Journal of Quantum Electronics*, vol. 27, No. 6, Jun., 1991, pp. 1332-1346.

Hasnian et al., "Monohthic Integration of Photodetector with Vertical Cavity Surface Emitting Laser," *Electronic Letters*, vol. 27, No. 18, Aug. 29, 1991, pp. 1630-1632.

Jewell et al., "Microlasers," *Scientific American*, vol. 265, No. 5, Nov., 1991, pp. 86-96.

*Primary Examiner*—William Mintel
*Attorney, Agent, or Firm*—Pennie & Edmonds

[57] ABSTRACT

Optoelectronic integrated circuits are disclosed comprising a vertical-cavity surface emitting laser (VCSEL) and a transistor. The VCSEL comprises a laser cavity sandwiched between two distributed Bragg reflectors. The laser cavity comprises a pair of spacer layers surrounding one or more active, optically emitting quantum-well layers having a bandgap in the visible range which serve as the active optically emitting material of the device. The thickness of the laser cavity is $m \lambda/2n_{eff}$ where m is an integer, $\lambda$ is the free-space wavelength of the laser radiation and $n_{eff}$ is the effective index of refraction of the cavity. Electrical pumping of the laser is achieved by heavily doping the bottom mirror and substrate to one conductivity-type and heavily doping the regions of the upper mirror with the opposite conductivity type to form a diode structure and applying a suitable voltage to the diode structure. Embodiments are disclosed which integrate the VCSEL with bipolar and FET transistors as well as phototransistors.

62 Claims, 12 Drawing Sheets

INTEGRATION OF TRANSISTORS WITH VERTICAL CAVITY SURFACE EMITTING LASERS

CROSS REFERENCE TO RELATED APPLICATIONS

This application is related to our co-pending application Ser. No. 07/790,964, filed Nov. 7, 1991, for "Visible Light Surface Emitting Semiconductor Laser" and to our application Ser. No. 07/823,418, filed concurrently herewith, for "Vertical-Cavity Surface Emitting Laser Optical Interconnect Technology," which are incorporated herein by reference.

FIELD OF THE INVENTION

This relates to the integration of semiconductor lasers with electronic devices. In particular, it relates to vertically arranged heterostructure lasers and their integration with devices such as transistors.

BACKGROUND OF THE INVENTION

Conventional edge-emitting laser diodes are well known. In these diodes, laser radiation is emitted in a plane that is a continuation of the plane of the p-n junction that forms the diode. Different types of these diodes are widely used to provide laser radiation in the infrared and visible regions. While these diodes have enjoyed considerable commercial success, they are relatively large and, as a result, are difficult to integrate with other devices.

Recently, a new class of semiconductor lasers known as a vertical cavity surface emitting laser has been developed. Unlike the edge-emitting laser, these vertical cavity lasers emit laser radiation in the direction perpendicular to the plane of the p-n junction formed in the laser diode. Considerable information concerning the structure and formation of such laser diodes is set forth, for example, in U.S. Pat. No. 4,949,350; in J. Jewell et al., "Microlasers," *Scientific American*. Vol. 265, No. 5, pp. 86–94 November 1991); in J. Jewell et al., "Vertical-Cavity Surface-Emitting Lasers: Design, Growth, Fabrication, Characterization," *IEEE Journal of Quantum Electronics*, Vol. 27, No. 6, pp. 1332–1346 (June 1991); in G. R. Olbright et al., "Cascadable Laser Logic Devices: Discrete Integration of Phototransistors with Surface-Emitting Laser Diodes," *Electronics Letters*, Vol. 27, No. 3, pp. 216–217 (Jan. 31, 1991); in J. Jewell et al., "Low-threshold Electrically-Pumped Vertical-Cavity Surface Emitting Lasers," *Electronics, Lett.*, Vol. 25, p. 1123 (1989); and in J. Jewell et al., "Vertical Cavity Lasers for Optical Interconnects," SPIE Vol. 1389 *International Conference on Advances in Interconnection and Packaging*, pp. 401–407 (1990), all of which are incorporated herein by reference.

As set forth in certain of the above-referenced publications, vertical cavity lasers have numerous advantages over edge-emitting lasers, some of the most important of which are that they can be fabricated in extremely small sizes (e.g., on the order of one micrometer in diameter) and can be integrated with other devices such as transistors.

SUMMARY OF THE INVENTION

The present invention is directed to such integration of vertical-cavity lasers. We have invented vertical-cavity lasers that are integrally formed with electronic switches such as three-terminal transistors.

In a preferred embodiment of the invention, a vertical-cavity surface-emitting laser (VCSEL) comprises a laser cavity sandwiched between two distributed Bragg reflectors. The laser cavity comprises a pair of spacer layers surrounding one or more active, optically emitting quantum-well layers which serve as the active optically emitting material of the device. The thickness of the laser cavity is $m\lambda/2n_{eff}$, where m is an integer, $\lambda$ is the wavelength of the laser radiation and $n_{eff}$ is the effective index of refraction of the cavity. Electrical pumping of the laser is achieved by heavily doping the bottom mirror and substrate to one conductivity-type and heavily doping regions of the upper mirror with the opposite conductivity type to form a diode structure and applying a suitable voltage to the diode structure.

The switch may take any number of forms and can be located in various positions relative to the VCSEL. The switch may be an electronic switch such as a bipolar transistor or a field effect transistor. In the case of the bipolar transistor, the transistor can be located underneath, on top of, or alongside the VCSEL, just like the photo-transistor. In the case of a field effect transistor, the transistor is located alongside the VCSEL.

The switch may also be an optical switch such as a photo-transistor located alongside the VCSEL.

Combinations of optically controlled and electrically controlled switches may also be implemented in accordance with the invention.

The integrated switching of the present invention provides a convenient means for controlling the output of laser radiation from the VCSEL with either optical or electrical signals. Boolean logic functions can readily be implemented by these switches; and signal amplification and conversion from electrical to optical or optical to electrical is easily achieved.

BRIEF DESCRIPTION OF THE DRAWING

These and other objects, features and advantages of the invention will be more readily apparent from the following detailed description of the invention in which.

DETAILED DESCRIPTION

Figure 1:
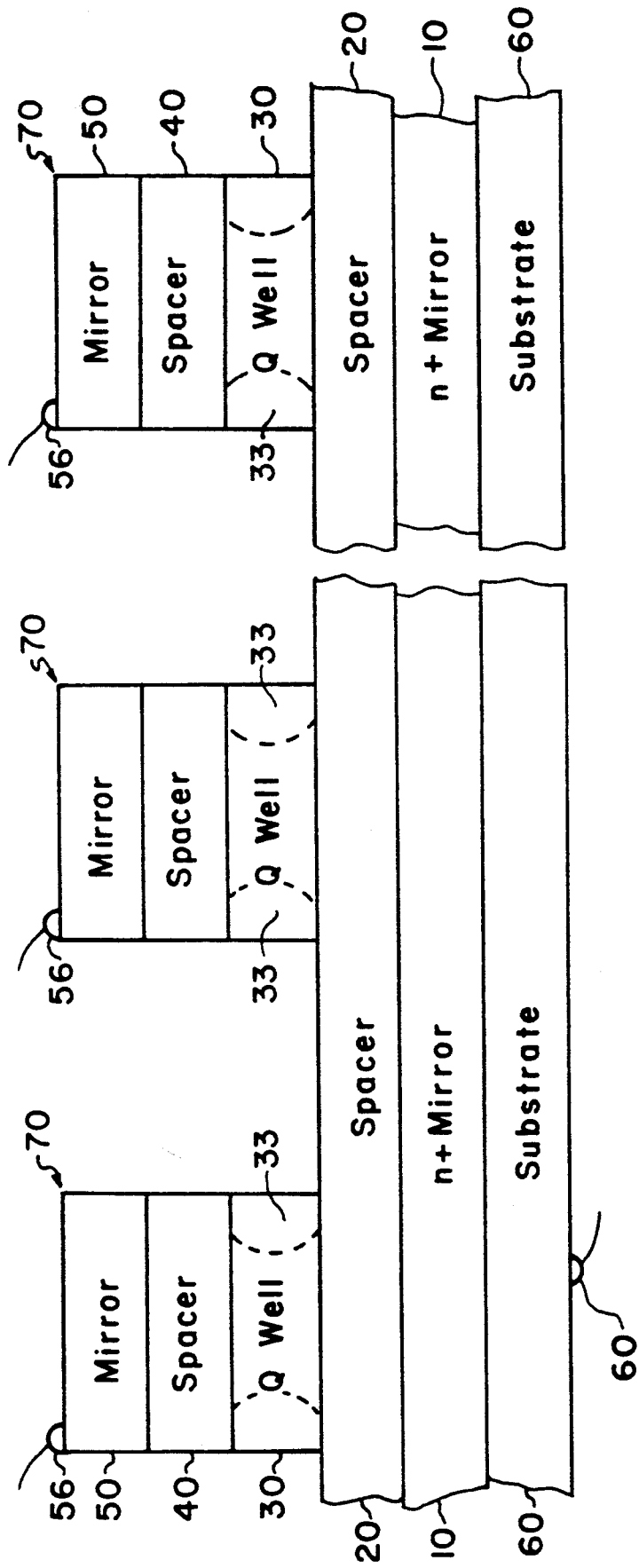
FIG. 1 is a schematic illustration of a prior art vertical cavity surface emitting laser.

As shown in FIG. 1, a prior art vertical-cavity surface emitting laser (VCSEL) comprises a first n+ mirror layer 10, a first spacer layer 20, a quantum well layer 30, a second spacer layer 40 and a second p+ mirror layer 50. Following techniques known in the art and described, for example, in the above-referenced U.S. Pat. No. 4,949,350, layers 10, 20, 30, and 40 and a portion of layer 50 are epitaxially formed on a substrate 60. The remaining portion of layer 50 is formed by dielectric deposition. As a result, layers 10, 20, 30, 40, and 50 have the same diameter as substrate 60.

Advantageously, a confinement region 33 is defined in the periphery of quantum well layer 30 by proton implantation so as to confine current flow in the laser to a narrow region around the central vertical axis of the laser. After the epitaxial formation of the layers, quantum well layer 30, spacer layer 40, and mirror layer 50 are defined by optical lithography and etching to form a plurality of columns 70. Electrical contacts to second mirror layer 50 and substrate 60 are provided at 56 and 66. Each column 70 is a separate laser and can be made to lase by applying a suitable voltage between contact 66 and contact 56 of that column to drive sufficient current through the column.

Illustratively, substrate 60 is a wafer of N+ doped GaAs having a diameter of 3 or 4 inches (7.5 or 10 cm.) during epitaxial processing; and, each column is about 20 micrometers in diameter and about 2.5 micrometers high above the surface of spacer 20. The wafer is ordinarily diced into several units for use.

Each of layers 10, 20, 30, 40, and 50 comprises a plurality of layers. For example, for the case of a red-light emitting vertical-cavity laser disclosed in our copending application Ser. No. 07/790,964, mirror layer 10 comprises alternating layers of n+ doped AlAs and AlGaAs, each layer being a quarter-wavelength thick where the wavelength is the wavelength in the layer of the radiation being emitted by the laser. As will be recognized by those skilled in the art, the construction of mirror layer 10 is that of a distributed Bragg reflector in which the AlAs is the layer having the lower index of refraction and AlGaAs is the layer having the higher index of refraction. Mirror 10 is designed so that it is completely reflective and has no transmission.

Spacer layer 20 comprises a plurality of layers of AlGaInP with progressively increasing amounts of Ga toward the quantum well layer. As is known in the art, these layers are lattice matched to the GaAs. Spacer layer 40 is similar in construction with progressively decreasing amounts of Ga toward mirror layer 50. Quantum well layer 30 comprises three approximately 50 Angstrom thick layers of GaInP separated by two approximately 90 Angstrom thick barrier layers of AlGaInP. Spacer layer 20, quantum well layer 30, and spacer layer 40 constitute the laser cavity. The length of the laser cavity (which is the thickness of layers 20, 30, and 40) is $m\lambda/2n_{eff}$ where $\lambda$ is the free space wavelength of laser radiation emitted, m is an integer and $n_{eff}$ is the effective refractive index of the cavity.

Second mirror layer 50 comprises a plurality of alternating layers of p+doped AlAs and AlGaAs. Again, each of these layers is a quarter-wavelength thick and these layers constitute a distributed Bragg reflector. The reflector, however, is partially transmissive to provide for the emission of laser radiation from the uppermost layer.

Numerous other VCSEL structures have been demonstrated and reported in the literature. See, for example, the references cited in the Background of the Invention and the disclosure in our concurrently filed application Ser. No. 07/823,418. In general, any of these structures can be used in the practice of the invention.

In accordance with the invention, optoelectronic integrated circuit devices are formed by combining VCSELs with three-terminal transistors. In addition, integrated circuits are also disclosed in which VCSELS are combined with heterojunction photo-transistors in novel combinations.

Figure 2C:
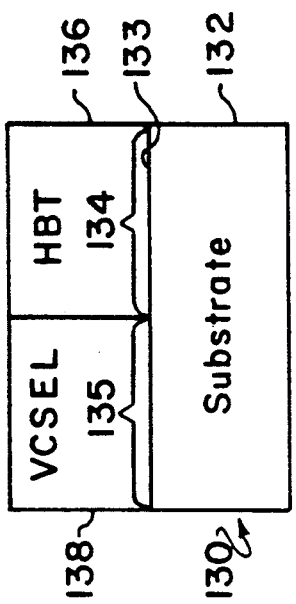
FIGS. 2A, 2B and 2C are schematic illustrations of an optoelectronic integrated circuit which combines a vertical cavity surface emitting laser with an heterojunction bipolar transistor.
Figure 2B:
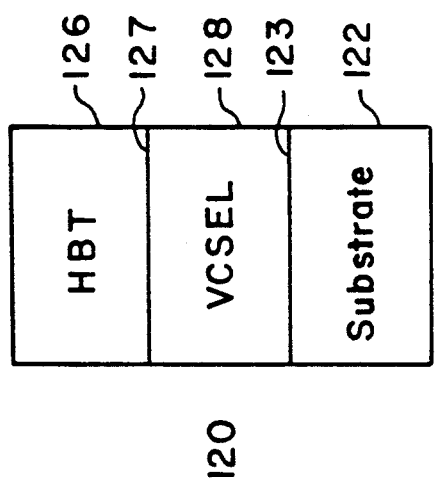
Figure 2A:
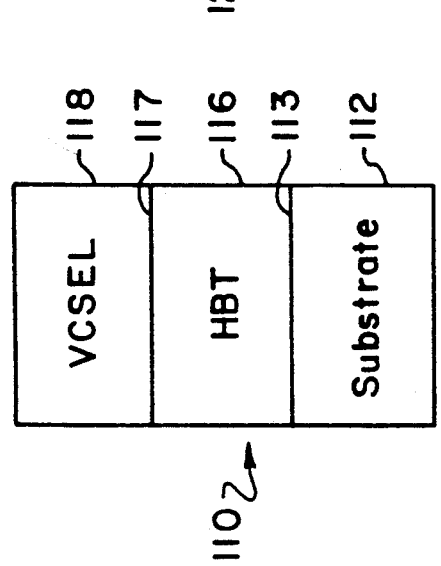

As shown in FIGS. 2A, 2B and 2C, a VCSEL may be combined with a heterojunction bipolar transistor (HBT) in any one of three ways. In FIG. 2A, an optoelectronic integrated circuit 110 is formed on a substrate 112 by forming an HBT 116 on an upper surface 113 of the substrate and by forming a VCSEL 118 on an upper surface 117 of the transistor. In FIG. 2B, an optoelectronic integrated circuit 120 is formed on a substrate 122 by forming a VCSEL 128 on an upper surface 123 of the substrate and by forming an HBT 126 on an upper surface 127 of the VCSEL. In FIG. 2C, an optoelectronic integrated circuit 130 is formed on a substrate 132 by forming a VCSEL 138 on a first portion 133 of an upper surface 135 of substrate 132 and by forming an HBT 136 above a second portion 134 of the upper surface 134 of substrate 132. Further details of these combinations are set forth in the figures immediately following.

Figure 3:
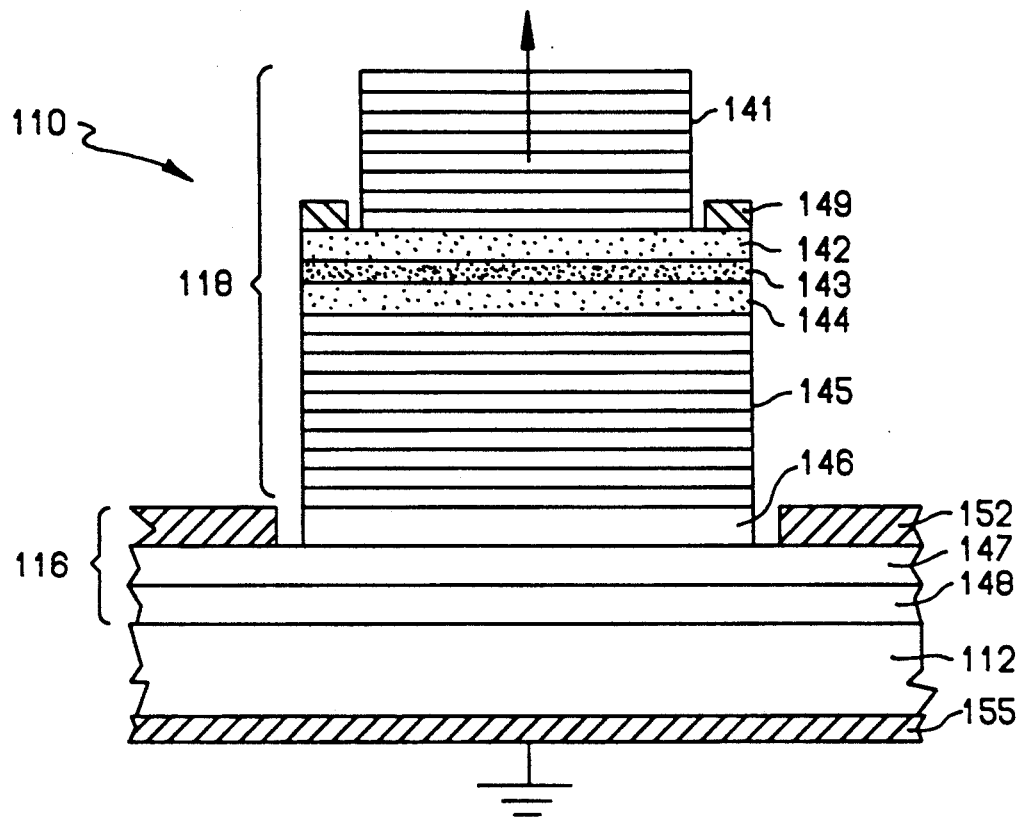
FIG. 3 is a more detailed illustration of the integrated circuit of FIG. 2A.

FIG. 3 depicts in greater detail integrated circuit 110 in which a VCSEL 118 is formed on an HBT 116 on a substrate 112. As shown in FIG. 3, VCSEL 118 comprises a partially transmissive mirror 141, a p-type spacer 142, a quantum well region 143, an n-type spacer 144 and an n-type mirror 145. Advantageously, the active portion of the quantum well region is narrowed by a peripheral confinement region (not shown) similar to confinement region 33 of FIG. 1. As noted in the discussion of FIG. 1, each of the mirrors, spacers and quantum wells of the VCSEL is made of several layers. Heterojunction bipolar transistor 116 is an n-p-n transistor comprising an n-type collector layer 146, a p-type base layer 147, and an n-type emitter layer 148. Circuit 110 further comprises an annular contact 149 to the upper surface of spacer 142, an annular contact 152 to base layer 147 and an n-type ohmic contact 155 to substrate 112.

Circuit 110 is formed by depositing the layers of elements 141-148, one on top of the other beginning with layer 148, on top of substrate 112. The layers of elements 142-148 are formed on substrate 112 by epitaxial growth using techniques well known to those skilled in the art and described, for example, in U.S. Pat. No. 4,949,350. The layers of mirror 141 may also be epitaxially grown. However, one advantage of the structure of FIG. 3 is that mirror 141 is not part of the electric circuit that biases the VCSEL. As a result, unlike mirror 145 which must be made of semiconductive materials since it is part of the biasing circuit, mirror 141 can be made of a much wider variety of materials and, in particular, can be made of dielectric materials.

Illustratively, substrate 112 is made of n-type GaAs and transistor 116 is a GaAs transistor comprising an emitter layer of n-type AlGaAs approximately 0.2 micrometers thick, a base layer of p-type GaAs approximately 0.25 micrometers thick, and a collector layer of n-type InGaAs/GaAs approximately 0.5 micrometers thick. Illustratively, VCSEL 118 is similar to that described in conjunction with FIG. 1 and includes mirrors comprising a plurality of alternating layers of AlAs and AlGaAs, spacers of layers of AlGAAs, and a quantum well layer made of layers of InGaAs separated by barrier layers of GaAs.

Following the deposition of the layers, individual integrated circuits 110 are defined by photolithographic and etching techniques. First, the upper mirrors of the circuits are defined by removing unwanted portions of these mirrors down to the upper surface of spacer 142. Next, the material of contact 149 is deposited; and the contact is defined by removing unwanted portions of the deposited material. The individual VCSELs are then defined by removing unwanted portions of spacers 142, 144, quantum well 143, mirror 145 and collector layer 146. The material of contact 152 is then deposited on the exposed surface of base layer 147. Finally, contact 152 is defined by removing unwanted portions of the deposited material.

Figure 4:
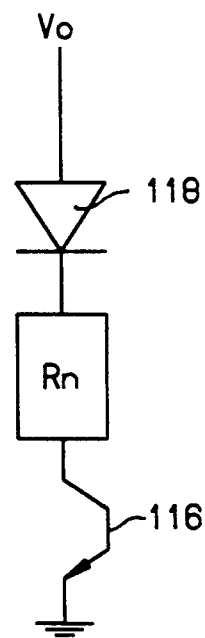
FIG. 4 is a circuit schematic for the integrated circuit of FIG. 3.

When a suitable voltage $V_o$ is applied between contact layer 149 and substrate 112 of circuit 110, the circuit will operate as an electrically switched laser. A schematic diagram of the circuit is shown in FIG. 4. As shown, the circuit comprises HPT 116, VCSEL 118, and resistor Rn which is the electrical resistance of mirror 145.

When sufficient electrical current (e.g., tens of micro-Amps)is supplied to base layer 147 of HBT 116, the transistor becomes conducting, with the result that there is substantial current flow (several milli-Amps) through VCSEL 118. This causes VCSEL 118 to lase, emitting laser radiation (about one milli-Watt) through partially transmissive mirror 141.

Figure 5:
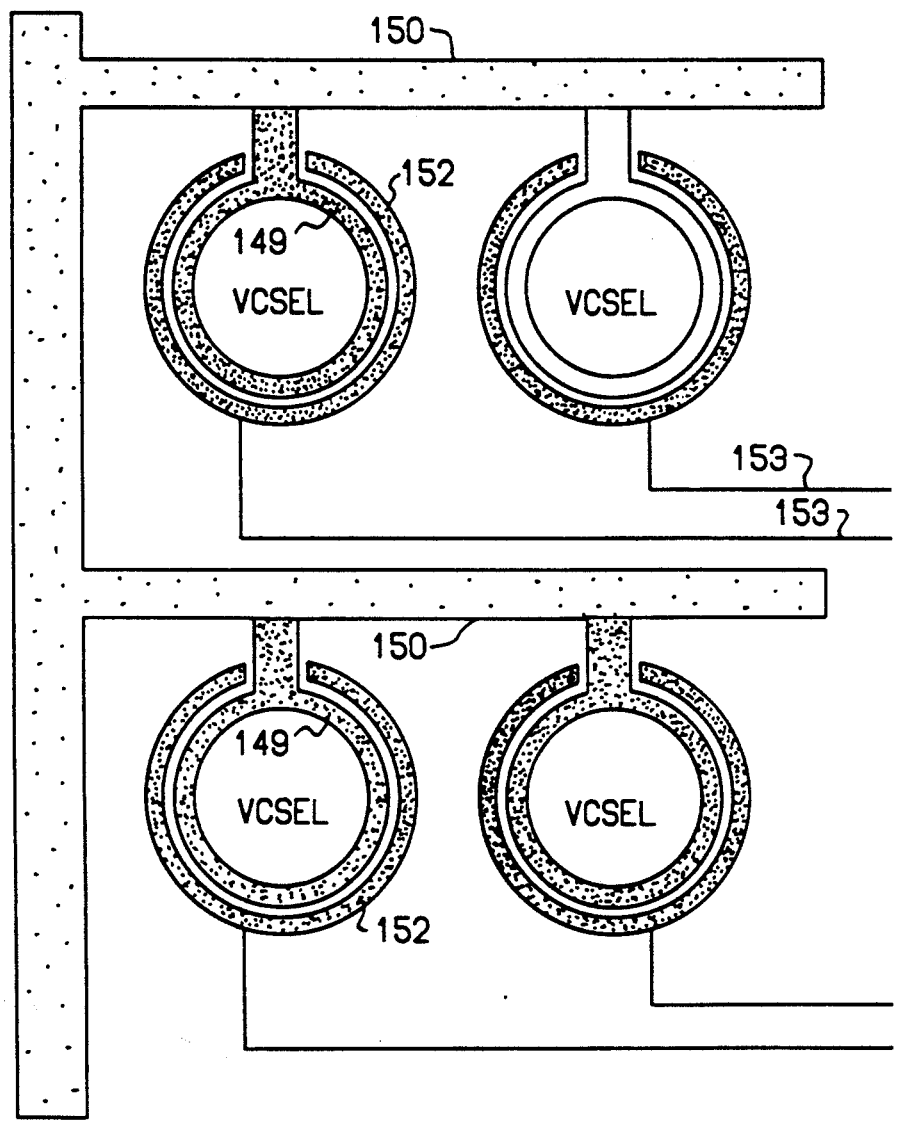
FIG. 5 is a top view of the integrated circuit of FIG. 3.

A top view of an array of the integrated circuits 110 of FIG. 3 is shown in FIG. 5. Advantageously, contact 152 extends around the periphery of the base of VCSEL 118. Contact 149 is annular in shape and surrounds upper mirror 141 of the VCSEL. Various arrangements may be made to establish electrical connection to contacts 149 and 152. In the illustrative embodiment of FIG. 5, contact 149 is connected to a common bus 150 to which a biasing voltage $V_o$ is applied to bias all the VCSELs in the array. Illustratively, each contact 152 is connected by an individual lead 153 to a separate bonding pad (not shown) so that individual control signals may be applied to the base of each VCSEL.

Figure 6:
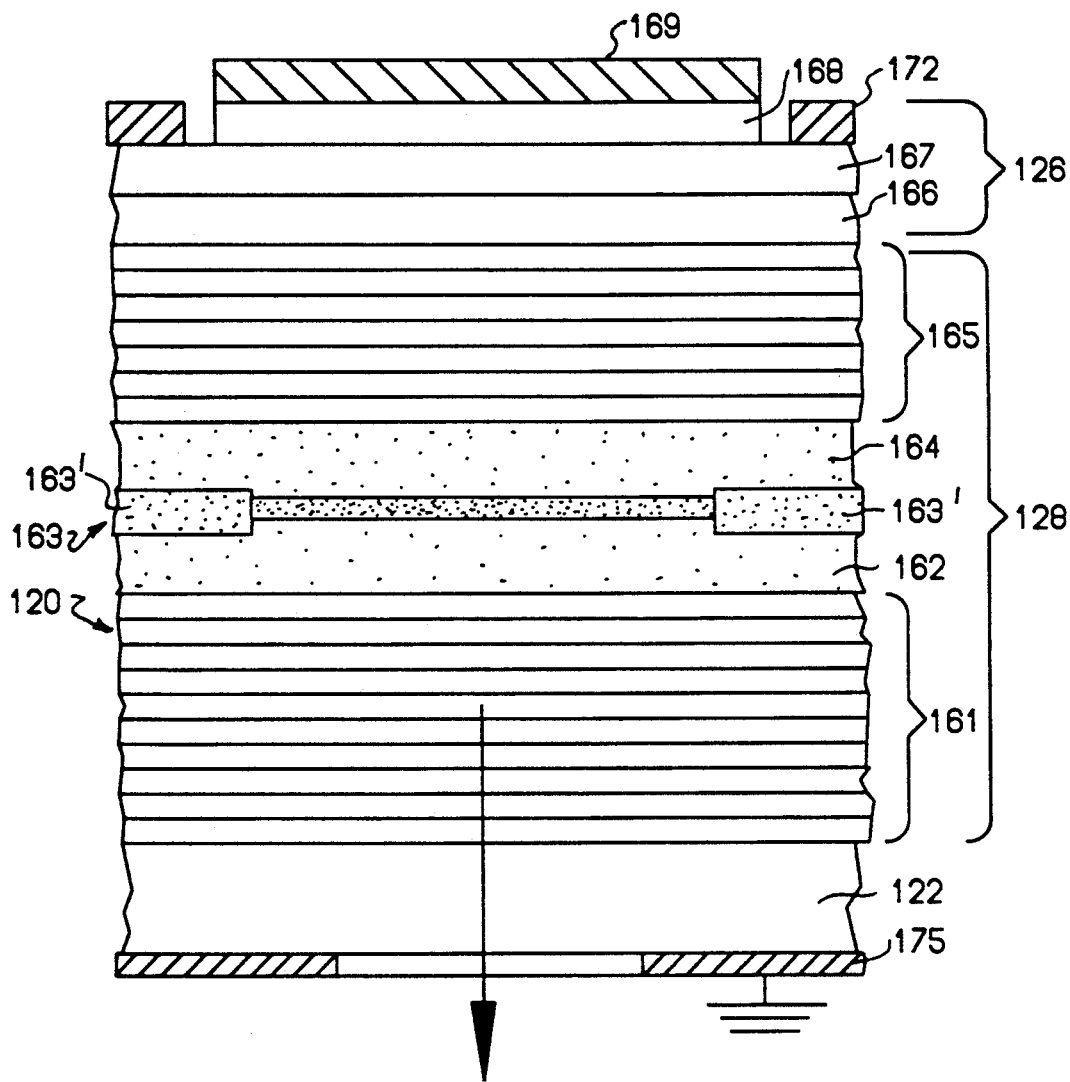
FIG. 6 is a more detailed illustration of the integrated circuit of FIG. 2B.

FIG. 6 depicts in greater detail integrated circuit 120 in which an HBT 126 is formed on a VCSEL 128 on a p-type substrate 122. As shown in FIG. 6, HBT 126 is a n-p-n transistor comprising an n-type collector layer 166, a p-type base layer 167 and an n-type emitter layer 168. VCSEL 128 comprises a partiality transmissive p-type mirror 161, a p-type spacer 162, a quantum well region 163, an n-type spacer 164 and an n-type mirror 165. Again, each of the mirrors, spacers and quantum well of VCSEL 128 is made of several layers; and the active portion of the quantum well region is advantageously circumscribed by a confinement region 163'. Circuit 120 further comprises contact 169 on the upper surface of emitter layer 168, an annular contact 172 on the upper surface of base layer 167 and a p-type ohmic contact 175 to substrate 122.

As will be apparent from a comparison of FIGS. 3 and 6, circuit 120 is similar to circuit 110 except that the VCSEL and HBT have been inverted and the electrical contacts have been changed. Fabrication of circuit 120 is similar to that of circuit 110 with appropriate changes in the order of deposition of the layers to achieve the difference in structure. Operation of circuit 120 is the same as the operation of circuit 110 but the bias voltage is $-V_o$ instead of $V_o$.

Circuit 120 has the advantage that it can be fabricated more easily than circuit 110 because it is not necessary to make a deep etch to access the base layer to form the contact thereto. Rather, it is only necessary to remove unwanted portions of emitter layer 168. Circuit 120 can be isolated from adjacent circuits on the same substrate by etching as done for the devices of FIGS. 1 and 3 or by conventional ion implantation techniques.

Figure 7:
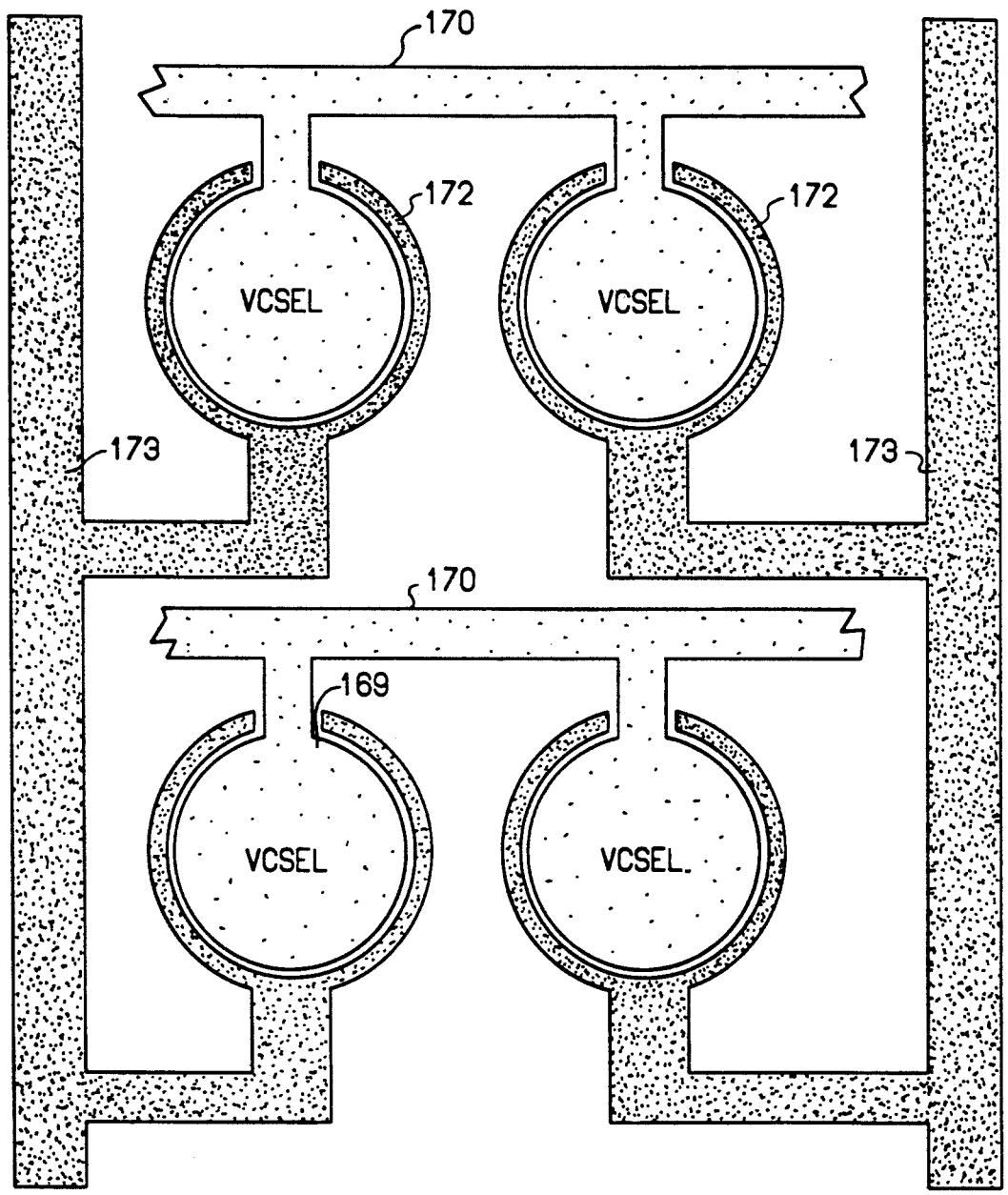
FIG. 7 is a top view of the integrated circuit of FIG. 6.

A top view of a two dimensional array of integrated circuits 120 is shown in FIG. 7. In this illustrative embodiment, each contact 169 is connected to a common row bus 170 to which a biasing voltage $-V_o$ is applied to bias all the VCSELs in that row of the array. Each contact 172 is connected by an individual lead to a common column bus 173. The row and column buses are electrically isolated from one another. As a result of this arrangement, an x-y addressing scheme is provided which permits one to selectively activate any one of the VCSELs in the two-dimensional array. If desired, other control arrangements could also be used such as the use of individual control leads to the base contact as shown in FIG. 5.

Figure 8:
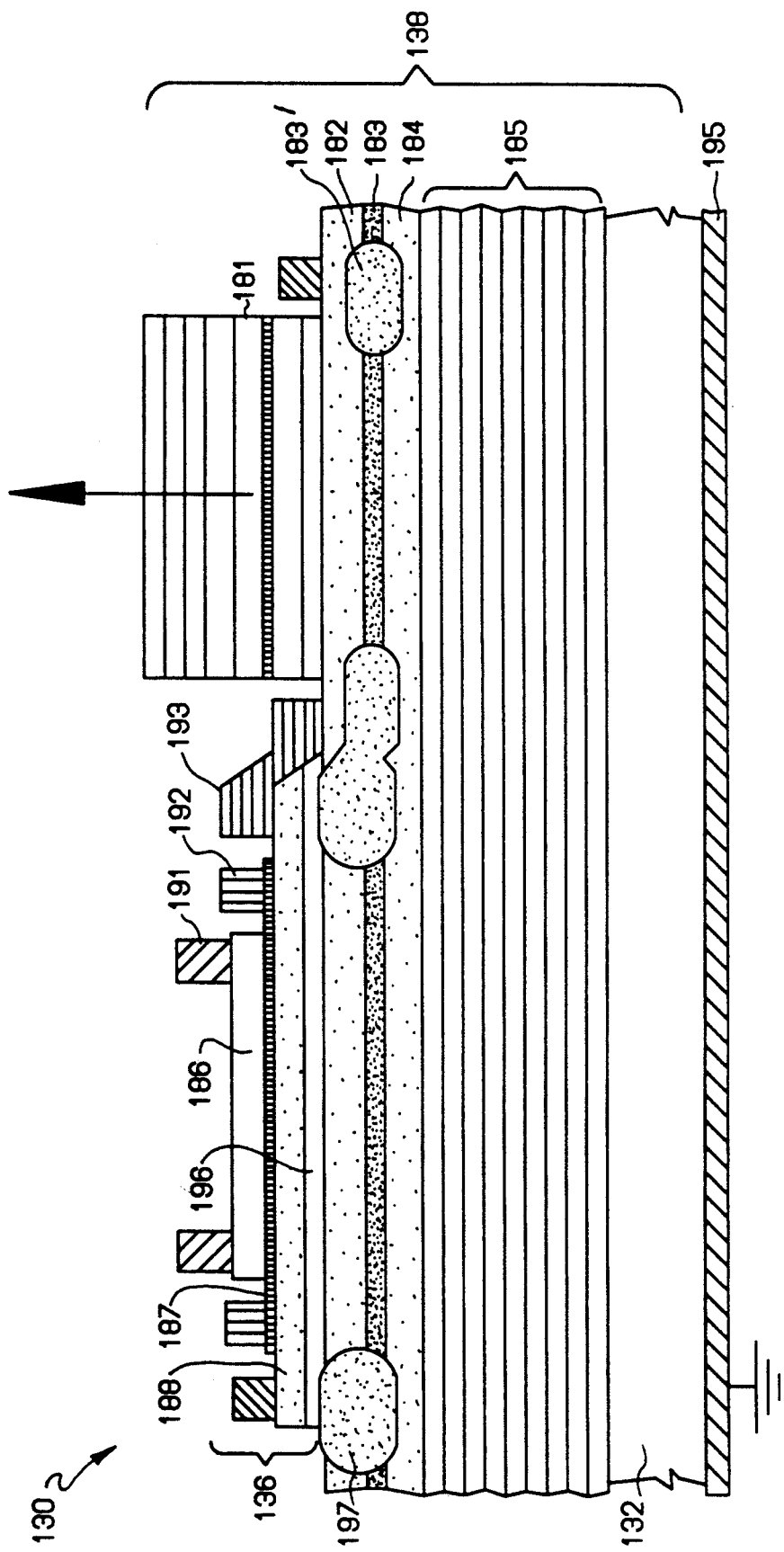
FIG. 8 is a more detailed illustration of the integrated circuit of FIG. 2C.
Figure 9:
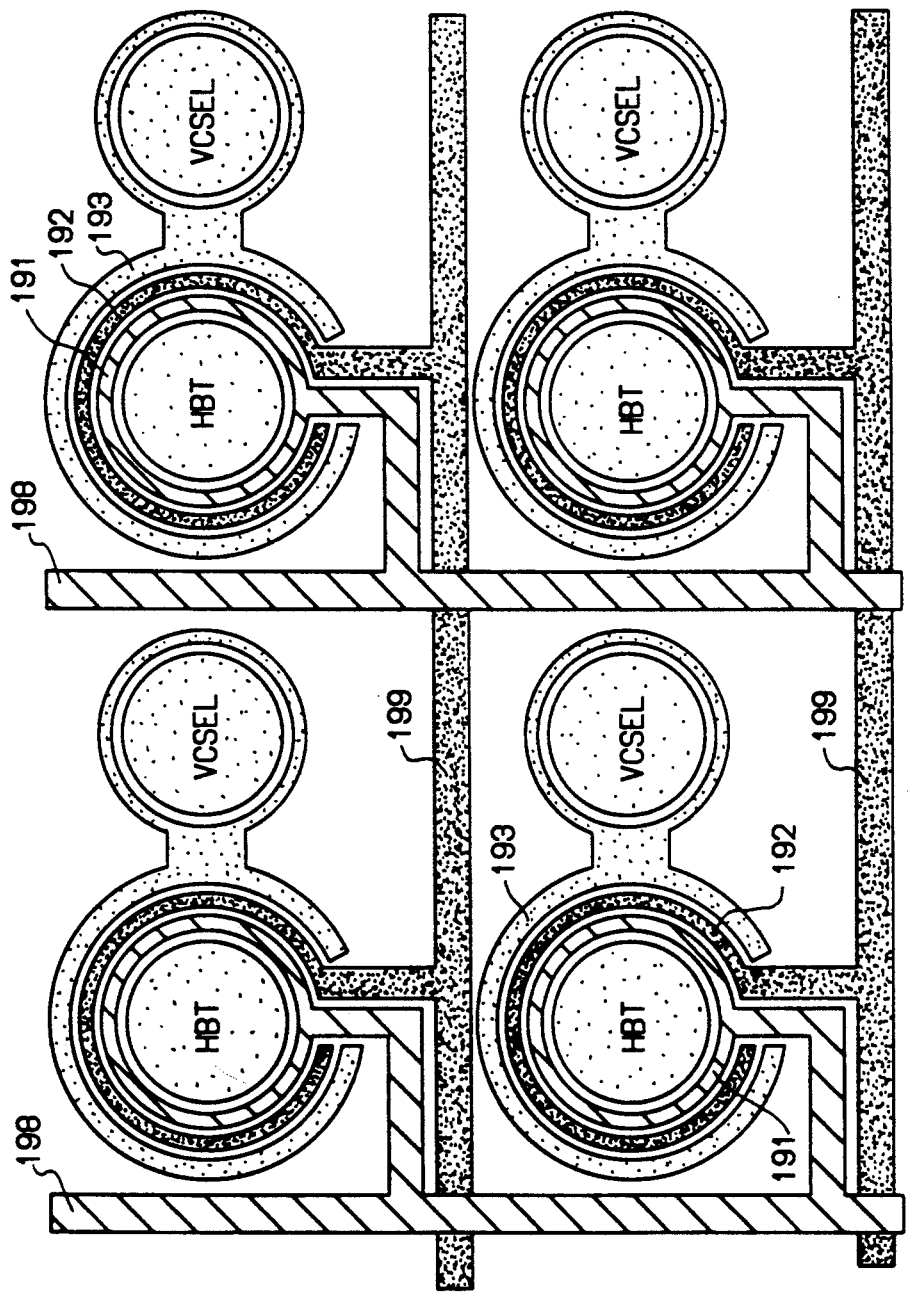
FIG. 9 is a top view of the integrated circuit of FIG. 8.

FIG. 8 depicts in greater detail integrated circuit 130 in which HBT 136 is formed alongside VCSEL 138. As shown in FIG. 8, VCSEL 138 comprises a partially transmissive mirror 181, a p-type spacer 182, a quantum well region 183, an n-type spacer 184 and an n-type mirror 185. Again, the active region of the quantum well layer is narrowed by a peripheral confinement region 183'. HBT 136 is an n-p-n transistor comprising an n-type collector layer 186, a p-type base layer 187, and an n-type emitter layer 188. Circuit 130 further comprises a contact 191 to collector layer 186, an annular contact 192 to base layer 187 and a contact 193 to emitter layer 188. As shown in FIG. 8, HBT 136 is formed on top of layers 182–185 of VCSEL 138 and alongside mirror 181 so that it is off-axis relative to the laser output of VCSEL 138. HBT 136 is electrically isolated from the region of the VCSEL over which it is formed by an insulating layer 196 and an ion-implanted guard ring 197 and is electrically connected by contact 193 to the region of the VCSEL in which lasing takes place. As suggested by FIG. 8 and as shown in FIG. 9, contact 193 comprises two interconnected annular contacts, one of which circumscribes the emitter layer and the other of which circumscribes mirror 181.

Circuit 130 is formed by depositing the layers of mirror 185, spacer 184, quantum well layer 183 and spacer 182 on substrate 132 in that order. Next, insulating layer 196 is formed on top of spacer layer 182 and emitter layer 188, base layer 187 and collector layer 186 are formed on top. Photolithographic techniques and etching are then used to define the HBTs and to remove unwanted material down to spacer 182. The layers of mirror 181 are then deposited and the mirror is defined by photolithographic techniques and etching. Finally, contacts 191, 192, 193 are deposited and defined.

In the embodiment shown in FIG. 8, mirror 181 includes the insulating layer 196 as well as the layers of semiconducting material that were deposited to form emitter 188, base 187 and collector 186. This is feasible as long as these materials do not absorb significant amounts of laser radiation from the VCSEL. This condition is met if the semiconductive materials have a higher bandgap energy than the laser frequency. Alternatively, the materials of layers 186, 187, 188 and 196 can be removed from the area where mirror 181 is to be formed and other materials can be used to form the layers of this mirror.

When a suitable voltage $V_o$ is applied between contact 191 and substrate 132 of circuit 130, the circuit will operate as an electrically switched laser in the same fashion as circuits 110 and 120.

A top view of a two-dimensional array of integrated circuits 130 is shown in FIG. 9. In this illustrative embodiment, contact 191 is connected to a common column bus 198 to which a biasing voltage $V_o$ is applied to bias the VCSELs in that column of the array. Illustratively, each contact 192 is connected to a common row bus 199. Again, the row and column buses are electrically isolated from one another. As a result of this arrangement, an x-y addressing scheme is provided which permits one to selectively activate any one of the VCSELs in the two-dimensional array.

Figure 10:
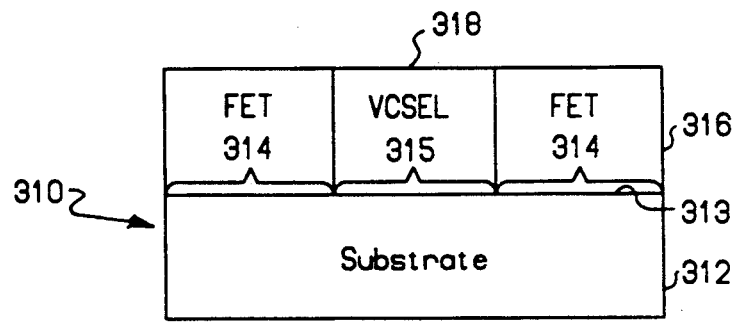
FIG. 10 is a schematic illustration of an optoelectronic integrated circuit which combines a vertical cavity surface emitting laser and a field effect transistor.

As shown in FIG. 10, a VCSEL may also be combined with a field effect transistor (FET). In this embodiment an optoelectronic integrated circuit 310 is formed on a substrate 312 by forming a VCSEL 318 on one portion 315 of an upper surface 313 of substrate 312 and by forming an FET 316 above a second portion 314 of the upper surface of the substrate.

Figure 11:
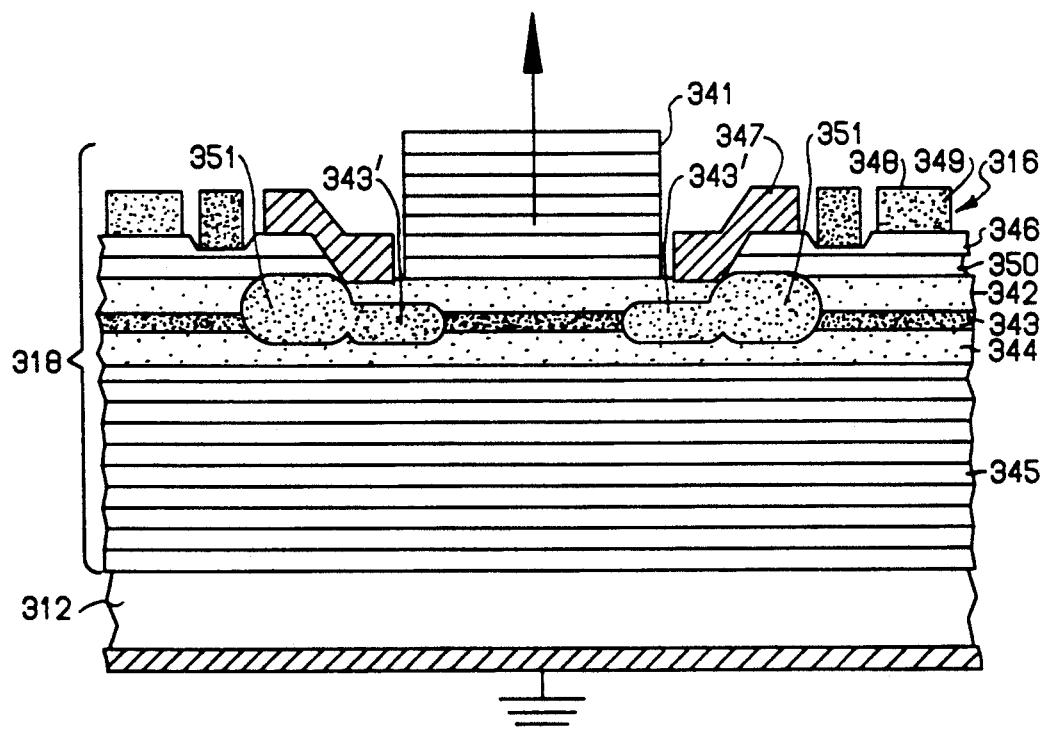
FIG. 11 is a more detailed illustration of the integrated circuit of FIG. 10.

FIG. 11 depicts in greater detail an illustrative embodiment of such a circuit. As shown in FIG. 11, VCSEL 318 comprises a partially transmissive mirror 341, a p-type spacer 342, a quantum well region 343, an n-type spacer 344 and an n-type mirror 345. Each of the mirrors, spacers and quantum well of the VCSEL is made of several layers; and the active quantum well is narrowed by confinement region 343'. Field effect transistor (FET) 316 comprises an n-type FET channel 346 and source, gate and drain electrodes 347, 348, 349, respectively, formed on top of an insulating layer 350. A guard ring 351 isolates source electrode 347 so that current flow must be through the narrow region surrounded by confinement region 343'.

Figure 12:
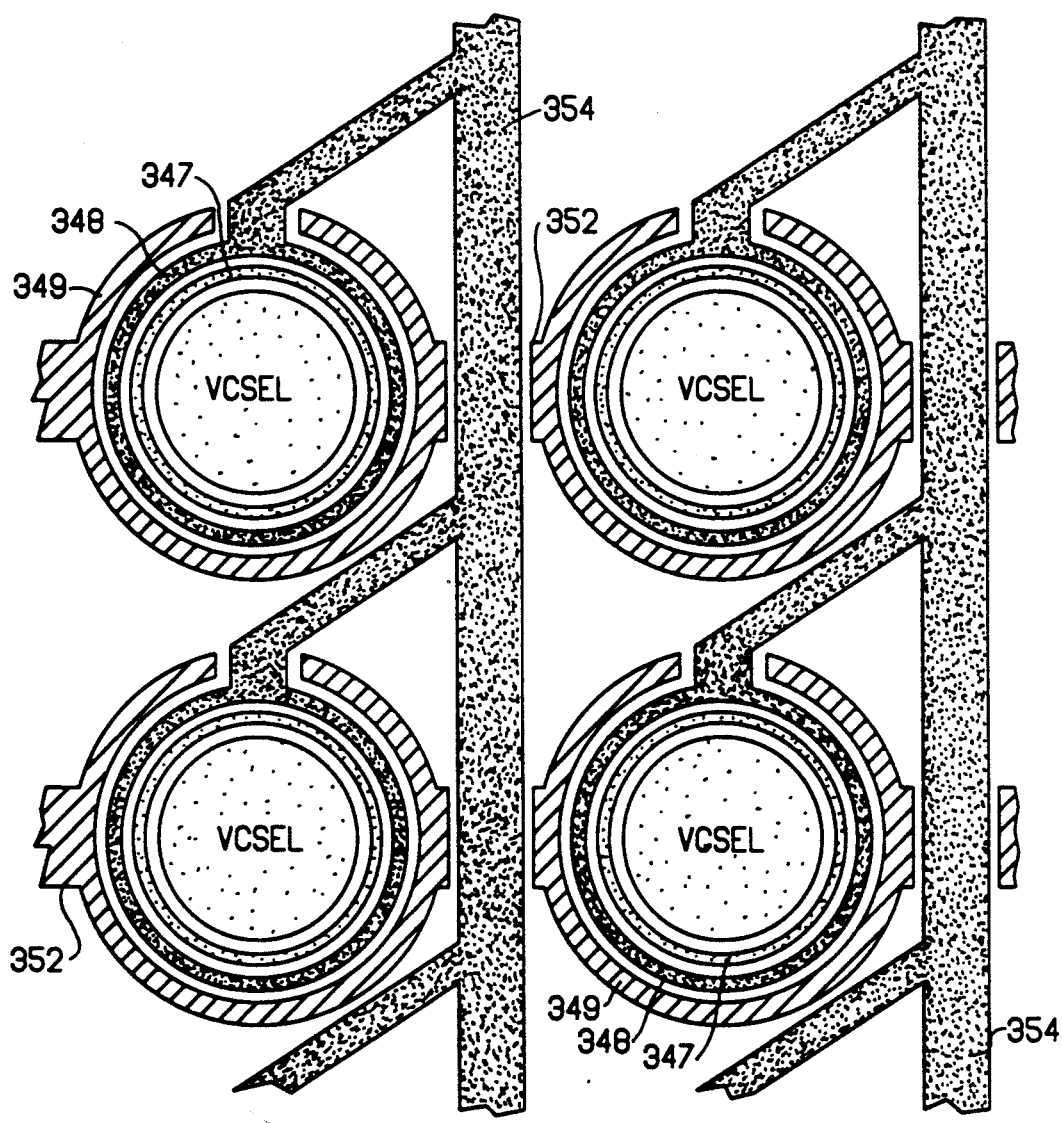
FIG. 12 is a top view of the illustrative embodiment of the integrated circuit of FIG. 11.

As suggested by FIG. 11 and as shown in the top view of FIG. 12, the FET surrounds substantially all of mirror 341 of the VCSEL. This arrangement advantageously permits the use of an annular gate electrode having a very long dimension transverse to channel 346. Since the maximum current through an FET channel is directly proportional to the transverse dimension of the channel, this annular geometry is very useful in providing the current (about 10 milliAmps) needed to drive a VCSEL.

Illustratively, substrate 312 is made of n-type GaAs and FET 316 is a GaAs or AlGaAs FET having a channel that is approximately 600 Angstrom thick under the gate electrode. Illustratively, VCSEL 318 is similar to that described in conjunction with FIG. 1 and includes mirrors comprising a plurality of alternating layers of doped AlAs and AlGaAs, spacers of AlGaInP, and a quantum well layer made of layers of GaInP separated by barrier layers of AlGaInP.

Circuit 310 is made in similar fashion to circuit 130 of FIG. 8 above. The layers of mirror 345, spacer 344, quantum well layer 343, and spacer 342 are deposited on substrate 312 in that order. To form the FET, insulating layer 350 is formed on top of spacer layer 342 and the FET channel is formed on top of the insulating layer. The layers of the mirror are then deposited and the shape of mirror 341 is then defined photolithographically and the deposited layers are removed from those areas not part of the mirror. Finally metallization is deposited and the source, gate and drain electrodes are formed.

When a suitable voltage $V_o$ is applied between drain electrode 349 and substrate 312 of circuit 310, the circuit will operate as an electrically switched laser responsive to voltage signals applied to gate electrode 348. Application of an appropriate voltage to the gate electrode will allow enough current to flow through VCSEL 318 to cause it to lase and emit laser radiation through mirror 341.

A top view of a two-dimensional array of circuits 310 is shown in FIG. 12. Advantageously, each drain electrode is connected to a common row bus 352 to which a biasing voltage $V_o$ is applied to bias all the VCSELs in that row of the array. Illustratively, each gate electrode is connected to a common column bus 354. Again, each row and column bus is electrically isolated. As a result, each VCSEL of the array can be individually addressed for operation.

Figure 13:
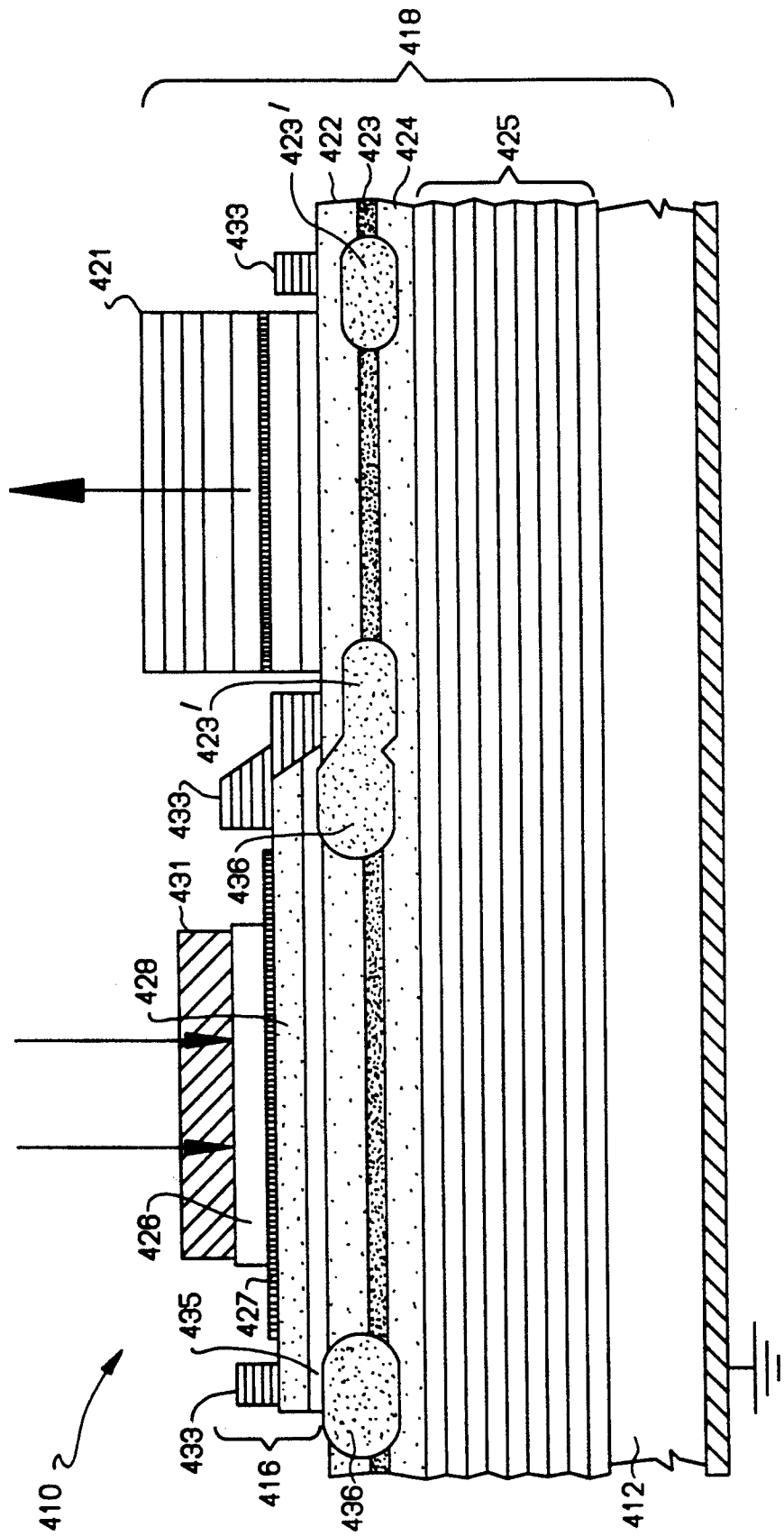
FIG. 13 is a schematic illustration of an optoelectronic integrated circuit which combines a vertical cavity surface emitting laser with a phototransistor.
Figure 14:
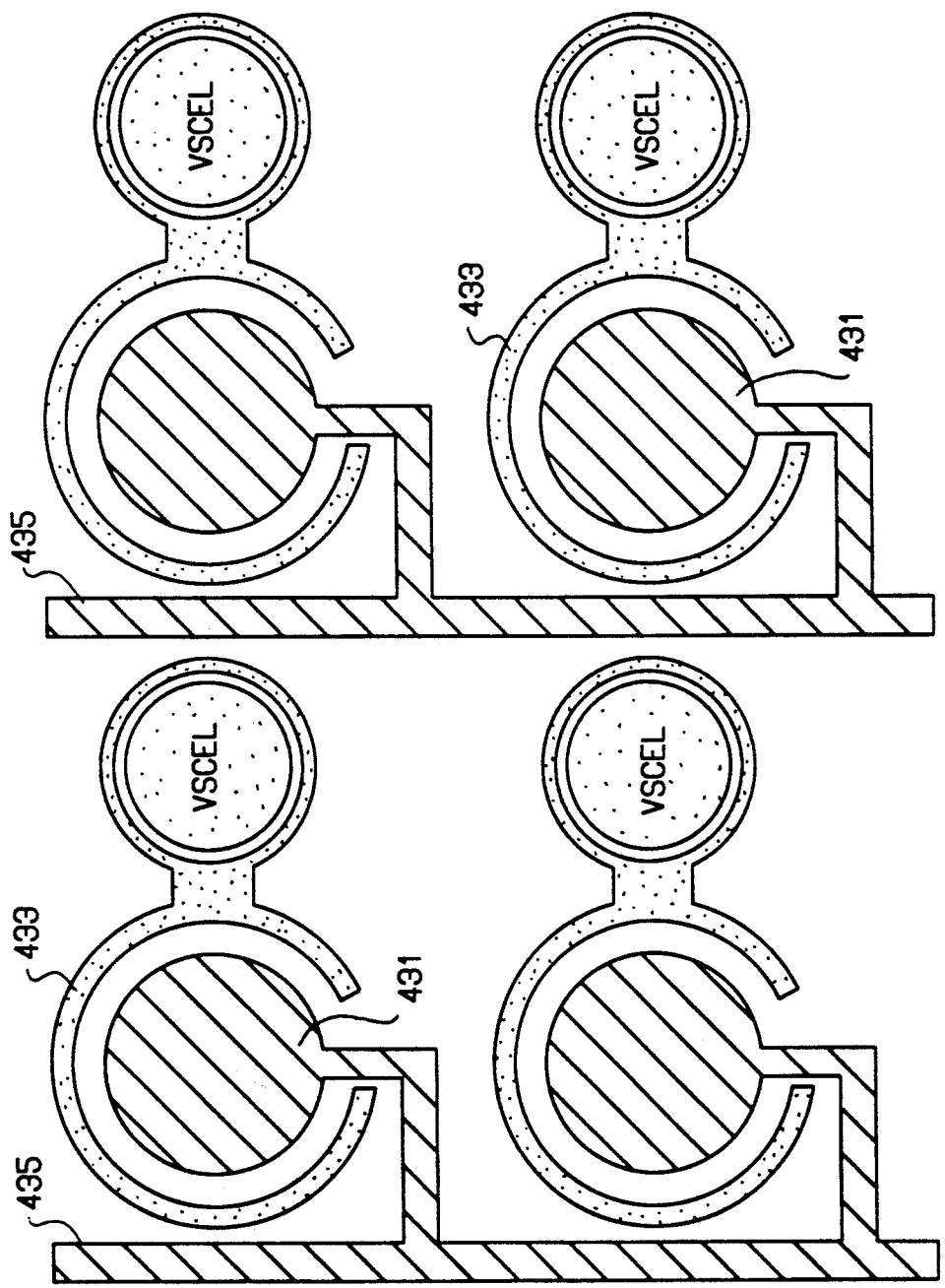
FIG. 14 is a more detailed illustration of the integrated circuit of FIG. 13.

FIGS. 13 and 14 depict in greater detail integrated circuit 410 in which a heterojunction phototransistor (HPT) 416 is formed alongside a VCSEL 418 on a substrate 412. As shown in FIG. 14, VCSEL 418 comprises a partially transmissive mirror 421, a p-type spacer 422, a quantum well region 423, an n-type spacer 424 and an n-type mirror 425. HPT 416 is an n-p-n transistor comprising an n-type collector layer 426, a p-type base layer 427, and an n-type emitter layer 428. Circuit 410 further comprises a transparent contact 431 to collector layer 426 and an annular contact 433 to emitter layer 428. HPT 416 is formed on top of layers 422–426 of VCSEL 418 and alongside mirror 421. It is electrically isolated from the region of the VCSEL over which it is formed by an insulating layer 435 and an ion-implanted guard ring 436 and is electrically connected by contact 433 to the region of the VCSEL in which lasing takes place. As suggested by FIG. 13, contact 433 comprises two interconnected annular contacts, one of which circumscribes the emitter layer and the other of which circumscribes mirror 421.

Fabrication of circuit 410 is similar to the fabrication of circuit 130. The layers of mirror 425, spacer 424, quantum well 423, spacer 422 and transistor 416 are deposited in succession on substrate 412. The layers of mirror 421 are then deposited; and the device structure is defined by photolithographic techniques and etching to remove the unwanted portions of the layers.

A top view of a two-dimensional array of integrated circuits 410 is shown in FIG. 14. Contacts 431 are connected to a common bus 435 to which a biasing voltage $V_o$ may be applied. When light of sufficient intensity in incident on the HPT, the HPT conducts and the VCSEL will lase.

Elementary Boolean logic functions can be implemented in circuit 410 by adjusting either the threshold at which the HPT becomes conducting or adjusting the intensity of the incident radiation which triggers the HPT. For example, an OR gate is implemented by making the conducting threshold low enough so that any beam of incident radiation that constitutes an input to the OR gate will trigger conduction in the HPT. An AND gate is implemented by setting the threshold or input intensities such that every beam of radiation that constitutes an input to the AND gate must be incident on the HPT to trigger conduction.

Numerous variations in the invention will be apparent to those skilled in the art from the foregoing description. For example, other material combination from the III-V and II-VI semiconductor groups such as ZnCdSe can be used in place of the materials specified for the quantum well layers, spacer layers and mirror layers. If desired both electrical and optical control of the VCSEL can be achieved in one structure by combining the HPT and HBT structures. For example, this can be done simply by adding a gate electrode to HPT 416 of FIG. 14 so that the outward appearance of the device is the same as that of circuit 130 of FIGS. 8 and 9.

What is claimed is:

1. An optoelectronic integrated circuit comprising:
   a substrate;
   a bipolar transistor formed on said substrate, said transistor comprising first, second and third layers of semiconductor material formed one on top of the other on said substrate, said second layer being a base layer and the other two layers being an emitter layer and a collector layer;
   a multi-layer surface emitting structure formed on the layers of said bipolar transistor, said surface emitting structure emitting optical radiation in a direction substantially perpendicular to the layers of said structure, said multi-layer surface emitting structure comprising:
   a first mirror formed on the bipolar transistor,
   a first spacer formed on the first mirror;
   an active layer comprising at least one quantum well layer formed on said first spacer,
   a second spacer formed on said active layer, and
   a second mirror formed on said second spacer, wherein the first and second mirrors each comprise a plurality of layers formed one on top of the other and at least the upper layers of the second mirror are smaller in lateral dimension than the underlying layers, whereby a portion of a surface of the uppermost underlying layer is not covered by the upper layers;
   electrical contacts to said surface emitting structure and to said substrate for applying a voltage across said surface emitting structure; and
   an electrical contact to said base layer of the bipolar transistor.

2. The circuit of claim 1 wherein the electrical contact to the surface emitting structure is formed on a portion of the surface of the uppermost underlying layer of the second mirror that is not covered by the upper layers.

3. The circuit of claim 1 wherein each of the layers of the first mirror is made of a semiconductive material.

4. The circuit of claim 1 wherein the upper layers of the second mirror are made of a dielectric material.

5. The circuit of claim 1 wherein the third layer of the bipolar transistor is smaller in lateral dimension than said second layer, whereby a portion of a surface of said second layer is not covered by said third layer.

6. The circuit of claim 5 wherein the electrical contact to the base layer is formed on a portion of the surface of said second layer that is not covered by said third layer.

7. The circuit of claim 6 wherein the electrical contact to the base layer extends around the periphery of the third layer and is isolated therefrom.

8. The circuit of claim 1 wherein the second mirror is smaller in lateral dimensions than the second spacer, whereby a portion of a surface of the second spacer is not covered by the second mirror.

9. The circuit of claim 8 wherein the electrical contact to the surface emitting structure is formed on a portion of the surface of the second spacer that is not covered by the second mirror.

10. The circuit of claim 8 wherein the layers of the second mirror are made of a dielectric material.

11. The optoelectronic circuit according to claim 1 further comprising a two-dimensional array wherein the electrical contacts to the surface emitting structures are connected together electrically.

12. The optoelectronic circuit according to claim 1 further comprising a two-dimensional array wherein the electrical contacts to the base layers are individually controlled.

13. The optoelectronic circuit according to claim 1 further comprising a two-dimensional array wherein there is a common electrical contact to the substrate of the circuits of the array, the electrical contacts to the surface emitting structures of the circuits are connected together within the same row (or column) and the electrical contacts to the base layers are connected together within the same column (or row).

14. An optoelectronic integrated circuit comprising:
   a substrate;
   a multi-layer surface emitting structure formed on said substrate, said surface emitting structure emitting optical radiation in a direction substantially perpendicular to the layers of said structure;
   a bipolar transistor formed on said surface emitting structure, said transistor comprising first, second and third layers of a semiconductor material formed one on top of the other on said surface emitting structure, said second layer being a base layer and the other two layers being an emitter layer and a collector layer, said third layer being smaller in lateral dimension than said second layer, whereby a portion of a surface of said second layer is not covered by said third layer;
   electrical contacts to said third layer and to said substrate for applying a voltage across said surface emitting structure; and
   an electrical contact to said base layer formed on a portion of the surface of said second layer that is not covered by said third layer.

15. The optoelectronic integrated circuit of claim 14 wherein the multi-layer surface emitting structure comprises;
   a first mirror formed on the bipolar transistor,
   a first spacer formed on the first mirror;
   an active layer comprising at least one quantum well layer formed on said first spacer,
   a second spacer formed on said active layer, and
   a second mirror formed on said second spacer.

16. The circuit of claim 15 wherein the first and second mirrors each comprises a plurality of layers formed one on top of the other.

17. The circuit of claim 16 wherein each of the layers of the first and second mirrors is made of a semiconductive material.

18. The circuit of claim 14 wherein the electrical contact to the base layer extends around the periphery of the third layer and is isolated therefrom.

19. The optoelectronic circuit according to claim 14 further comprising a two-dimensional array wherein the electrical contacts to the surface emitting structures are connected together electrically.

20. The optoelectronic circuit according to claim 14 further comprising a two-dimensional array wherein the electrical contacts to the base layers are individually controlled.

21. The optoelectronic circuit according to claim 14 further comprising a two-dimensional array wherein there is a common electrical contact to the substrate of the circuits of the array, the electrical contacts to the surface emitting structures of the circuits are connected together within the same row (or column) and the electrical contacts to the base layers are connected together within the same column (or row).

22. An optoelectronic integrated circuit comprising:
a substrate;
a multi-layer vertical cavity surface emitting structure formed on said substrate, said surface emitting structure emitting optical radiation in a direction substantially perpendicular to the layers of said structure, said structure comprising:
a first mirror formed on the substrate,
a first spacer formed on the first mirror,
an active layer comprising at least one quantum well layer formed on said first spacer,
a second spacer formed on said active layer, and
a second mirror formed on said second spacer, said second mirror being smaller in lateral dimensions than said second spacer, whereby a portion of a surface of said second spacer is not covered by the second mirror;
a bipolar transistor formed on a portion of the surface of the second spacer that is not covered by the second mirror, said transistor comprising first, second and third layers of semiconductor material formed one on top of the other, said second layer being a base layer and the other two layers being an emitter layer and a collector layer, said third layer being smaller in lateral dimensions than said second layer, whereby a portion of a surface of said second layer is not covered by said third layer;
electrical contacts to said surface emitting structure and to said substrate for applying a voltage across said surface emitting structure;
an electrical contact to said base layer formed on a portion of the surface of said second layer that is not covered by said third layer; and
an electrical contact to said third layer.

23. The circuit of claim 22 wherein the first and second mirrors each comprise a plurality of layers formed one on top of the other.

24. The circuit of claim 23 wherein each of the layers of the first mirror is made of a semiconductive material.

25. The circuit of claim 22 wherein the electrical contact to the surface emitting structure is formed on a portion of the surface of the second spacer that is not covered by the second mirror.

26. The circuit of claim 25 wherein the electrical contact to the surface emitting structure extends around the periphery of the second mirror.

27. The circuit of claim 25 wherein the electrical contact to the surface emitting structure makes electrical contact with the first layer.

28. The circuit of claim 25 wherein the electrical contact to the surface emitting structure also extends around the periphery of the second layer in contact with the first layer and isolated from the second layer.

29. The circuit of claim 22 wherein the layers of the second mirror are made of a dielectric material.

30. The circuit of claim 22 wherein the electrical contact to the base layer extends around the periphery of the third layer and is isolated therefrom.

31. The optoelectronic circuit according to claim 22 further comprising a two-dimensional array wherein the electrical contacts to the surface emitting structures are connected together electrically.

32. The optoelectronic circuit according to claim 22 further comprising a two-dimensional array wherein the electrical contacts to the base layers are individually controlled.

33. The optoelectronic circuit according to claim 22 further comprising a two-dimensional array wherein there is a common electrical contact to the substrate to the circuits of the array, the electrical contacts to the third layers of the circuits are connected together within the same row (or column) and the electrical contacts to the base layers are connected together within the same column (or row).

34. An optoelectronic integrated circuit comprising:
a substrate;
a multi-level vertical cavity surface emitting structure formed on said substrate, said surface emitting structure emitting optical radiation in a direction substantially perpendicular tot he layers of said structure, said structure comprising:
a first mirror formed on the substrate,
a first spacer formed on the first mirror,
an active layer comprising at least one quantum well layer formed on said first spacer,
a second spacer formed on said active layer, and
a second mirror formed on said second spacer, said second mirror being smaller in lateral dimensions than said second spacer, whereby a portion of a surface of said second spacer is not covered by the second mirror;
a field effect transistor having source, gate and drain electrodes and a channel region formed on a portion of the surface of the second spacer that is not covered by the second mirror,
electrical contacts to said surface emitting structure and said substrate; and
electrical contacts to said source, gate, and drain electrodes.

35. The circuit of claim 34 wherein the first and second mirrors each comprises a plurality of lasers formed one on top of the other.

36. The circuit of claim 35 wherein each of the layers of the first mirror is made of a semiconductive material.

37. The circuit of claim 35 wherein the layers of the second mirror are made of a dielectric material.

38. The circuit of claim 34 wherein the electrical contact to the surface emitting structure is formed on a portion of the surface of the second spacer that is not covered by the second mirror.

39. The circuit of claim 34 wherein the electrical contact to the surface emitting structure extends around the periphery of the second mirror.

40. The circuit of claim 34 wherein the source, gate and drain electrodes extend around the periphery of the second mirror and either the drain or the source electrode makes electrical contact to the surface emitting structure.

41. The optoelectronic circuit according to claim 34 further comprising a two-dimensional array wherein the electrical contacts to the surface emitting structures are connected together electrically.

42. The optoelectronic circuit according to claim 34 further comprising a two-dimensional array wherein the electrical contacts to the gate electrodes are individually controlled.

43. The optoelectronic circuit according to claim 34 further comprising a two-dimensional array wherein there is a common electrical contact to the substrate of the circuits of the array, the electrical contacts to either the source or the drain of the circuits are connected together within the same row (or column) and the electrical contacts to the gate electrodes are connected together within the same column (or row).

44. The circuit of claim 43 wherein the source, gate and drain electrodes extend around the periphery of the second mirror and either the drain or the source electrode makes electrical contact to the surface emitting structure.

45. An optoelectronic integrated circuit comprising:
a substrate;
a multi-layer vertical cavity surface emitting structure formed on said substrate, said surface emitting structure emitting optical radiation in a direction substantially perpendicular to the layers of said structure, said structure comprising:
a first mirror formed on the substrate,
a first spacer formed on the first mirror,
an active layer comprising at least one quantum well layer formed on said first spacer,
a second spacer formed on said active layer, and
a second mirror formed on said second spacer, said second mirror being smaller in lateral dimensions than said second spacer, whereby a portion of a surface of said second spacer is not covered by the second mirror;
a bipolar photo-transistor formed on a portion of the surface of the second spacer that is not covered by the second mirror, said transistor comprising first, second and third layers of semiconductor material formed one on top of the other, said second layer being a base layer and the other two layers being an emitter layer and a collector layer, said third layer being smaller in lateral dimensions than said second layer, whereby a portion of a surface of said second layer is not covered by said third layer;
electrical contacts to said surface emitting structure and to said substrate for applying a voltage across said surface emitting structure; and
an electrical contact to said third layer.

46. The circuit of claim 45 wherein the first and second mirrors each comprises a plurality of layers formed one on top of the other.

47. The circuit of claim 46 wherein each of the layers of the first mirror is made of a semiconductive material.

48. The circuit of claim 45 wherein the electrical contact to the surface emitting structure is formed on a portion of the surface of the second spacer that is not covered by the second mirror.

49. The circuit of claim 48 wherein the electrical contact to the surface emitting structure extends around the periphery of the second mirror.

50. The circuit of claim 48 wherein the electrical contact to the surface emitting structure makes electrical contact with the first layer.

51. The circuit of claim 48 wherein the electrical contact to the surface emitting structure also extends around the periphery of the second layer in contact with the first layer and isolated from the second layer.

52. The circuit of claim 45 wherein the layers of the second mirror are made of a dielectric material.

53. The optoelectronic circuit according to claim 45 further comprising a two-dimensional array wherein the electrical contacts to the surface emitting structures are connected together electrically.

54. The optoelectronic circuit according to claim 45 further comprising a two-dimensional array wherein there is a common electrical contact to the substrate of the circuits of the array and the electrical contacts to the third layers of the circuits are connected together.

55. A two-dimensional electrically random-addressable surface emitting array comprising:
a plurality of optoelectronic circuits integrally formed on a substrate, each circuit comprising a transistor integrally formed with a multi-layer surface emitting structure, the surface emitting structure emitting optical radiation in a direction substantially perpendicular to the layers of said structure, the transistor being connected so as to control the output of optical radiation emitted from the surface emitting structure;
the multi-layer surface emitting structure comprising:
a first multi-layer mirror,
a first spacer formed on the first mirror;
an active layer comprising at least one quantum well layer formed on said first spacer,
a second spacer formed on said active layer, and
a second multi-layer mirror formed on said second spacer wherein at least the upper layers of the second mirror are smaller in lateral dimensions than the underlying layers, whereby a portion of a surface of the uppermost underlying layer is not covered by the upper layers, and an electrical contact to the surface emitting structure is formed on a portion of the surface of the uppermost underlying layer that is not covered by the upper layers; and
electrically addressable means for separately activating individual circuits of the array.

56. The array of claim 55 wherein the transistor comprises first, second and third layers of semiconductive material formed one on top of the other, said second layer being a base layer and the other two layers being an emitter layer and a collector layer.

57. The array of claim 56 wherein each surface emitting structure is integrally formed on a transistor.

58. The array of claim 57 wherein the plurality of optoelectronic circuits are formed in rows and columns and the electrically addressable means comprises:
a row bus comprising a first set of conducting lines, each line contacting one of the upper layers of the surface emitting structure; and
a column bus comprising a second set of conducting lines, each line contacting the second layer of the transistors of a column of the circuits.

59. The array of claim 58 wherein the third layer is smaller in lateral dimensions than the second layer, whereby a portion of the surface of the second layer is not covered by said third layer, said column bus contacting the second layer on a portion of said surface.

60. The array of claim 55 wherein the second mirror is smaller in lateral dimensions than the second spacer whereby a portion of a surface of the second spacer is not covered by the second mirror, and an electrical contact to the surface emitting structure is formed on a portion of the surface of the second spacer that is not covered by the second mirror.

61. The array of claim 55 wherein each transistor comprises a field effect transistor integrally formed on the second spacer.

62. The array of claim 61 wherein the plurality of optoelectronic circuits are formed in rows and columns and the electrically addressable means comprises:
 a row bus comprising a first set of conducting lines, each line contacting drain (or source) terminals of the field effect transistors of a row of the circuit; and
 a column bus contacting a second set of conducting lines, each line connecting the gate terminals of the field effect transistors of a column of the circuits.

* * * * *